(12) United States Patent
Yang et al.

(10) Patent No.: US 10,628,344 B2
(45) Date of Patent: Apr. 21, 2020

(54) CONTROLLING METHOD, CHANNEL OPERATING CIRCUIT AND MEMORY SYSTEM FOR EXECUTING MEMORY DIES WITH SINGLE CHANNEL

(71) Applicant: MACRONIX INTERNATIONAL CO., LTD., Hsinchu (TW)

(72) Inventors: Tzu-Yi Yang, Hsinchu (TW); Yi-Chun Liu, Zhubei (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 70 days.

(21) Appl. No.: 15/712,456

(22) Filed: Sep. 22, 2017

(65) Prior Publication Data

US 2019/0095364 A1 Mar. 28, 2019

(51) Int. Cl.
*G06F 12/12* (2016.01)
*G06F 13/16* (2006.01)
*G06F 3/06* (2006.01)
*G11C 16/14* (2006.01)

(52) U.S. Cl.
CPC ........ *G06F 13/1673* (2013.01); *G06F 3/0614* (2013.01); *G06F 3/0653* (2013.01); *G06F 3/0688* (2013.01); *G06F 13/1642* (2013.01); *G06F 13/1657* (2013.01); *G11C 16/14* (2013.01)

(58) Field of Classification Search
CPC .................. G06F 13/1673; G06F 13/1642
USPC ......................................................... 711/100
See application file for complete search history.

(56) References Cited

U.S. PATENT DOCUMENTS

| | | | |
|---|---|---|---|
| 2003/0093612 A1* | 5/2003 | Ootani | G06F 12/0246 711/103 |
| 2006/0080477 A1 | 4/2006 | Seigneret et al. | |
| 2010/0262767 A1 | 10/2010 | Borchers et al. | |
| 2011/0131385 A1* | 6/2011 | Henriksson | G06F 13/1642 711/158 |
| 2015/0149694 A1 | 5/2015 | Tuers et al. | |
| 2015/0234756 A1 | 8/2015 | Tuers et al. | |
| 2016/0026405 A1* | 1/2016 | Dhuse | G06F 11/1092 711/114 |
| 2017/0075572 A1 | 3/2017 | Utevsky et al. | |

\* cited by examiner

*Primary Examiner* — Jae U Yu
(74) *Attorney, Agent, or Firm* — McClure, Qualey & Rodack, LLP

(57) ABSTRACT

A controlling method, a channel operating circuit and a memory system for executing a plurality of memory dies with single channel are provided. The plurality of memory dies correspond to a plurality of queue sections of a command queue. The controlling method comprises the following steps: A selecting unit selects one of the plurality of queue sections corresponding one of the plurality of memory dies which is riot at a busy state. An executing unit executes a command stored in one of the plurality of queue sections which is selected.

16 Claims, 13 Drawing Sheets

CONTROLLING METHOD, CHANNEL OPERATING CIRCUIT AND MEMORY SYSTEM FOR EXECUTING MEMORY DIES WITH SINGLE CHANNEL

TECHNICAL FIELD

The disclosure relates in general to a controlling method, a channel operating circuit and a memory system, and more particularly to a controlling method, a channel operating circuit and a memory system for executing memory dies with single channel.

BACKGROUND

Along with the development of memory, various memories are invented. One memory may include a plurality of memory dies. Those memory dies may be controlled by a controller via single channel. When multiple commands are needed to be executed for those memory dies, only one command can be executed via the single channel.

In the practical experience, the channel may be idle while one command is executed for one of the memory dies. Therefore, the bandwidth of the single channel cannot be used efficiently.

SUMMARY

The disclosure is directed to a controlling method for executing a plurality of memory dies with single channel, a memory interface circuit and a memory system. The busy state of each of the memory dies is used to decide which queue section should be operated in the single channel. Therefore, the bandwidth of the single channel can be efficiently used.

According to one embodiment, a controlling method for executing a plurality of memory dies with single channel is provided. The plurality of memory dies correspond to a plurality of queue sections of a command queue. The controlling method comprises the following steps: A selecting unit selects one of the plurality of queue sections corresponding one of the plurality of memory dies which is not at a busy state. An executing unit executes a command stored in one of the plurality of queue sections which is selected.

According to another embodiment, a channel operating circuit for executing a plurality of memory dies with single channel is provided. The channel operating circuit includes a command queue including a plurality of queue sections, a selecting unit and an executing unit. Each of the plurality of queue sections corresponds one of the plurality of memory dies. The selecting unit is for selecting one of the plurality of queue sections corresponding one of the plurality of memory dies which is not at a busy state. The executing unit is for executing a command stored in one of the plurality of queue sections which is selected.

According to an alternative embodiment, a memory system is provided. The memory system includes a plurality of memory dies, and a controller. The controller includes a memory interface circuit. The memory interface circuit includes at least one channel operating circuit for executing the plurality of memory dies with single channel. The channel operating circuit includes a command queue, a selecting unit and an executing unit. The command queue includes a plurality of queue sections. The plurality of queue sections correspond the plurality of memory dies. The selecting unit is for selecting one of the plurality of queue sections corresponding one of the plurality of memory dies which is not at a busy state. The executing unit is for executing a command stored in one of the plurality of queue sections which is selected.

Figure 1:
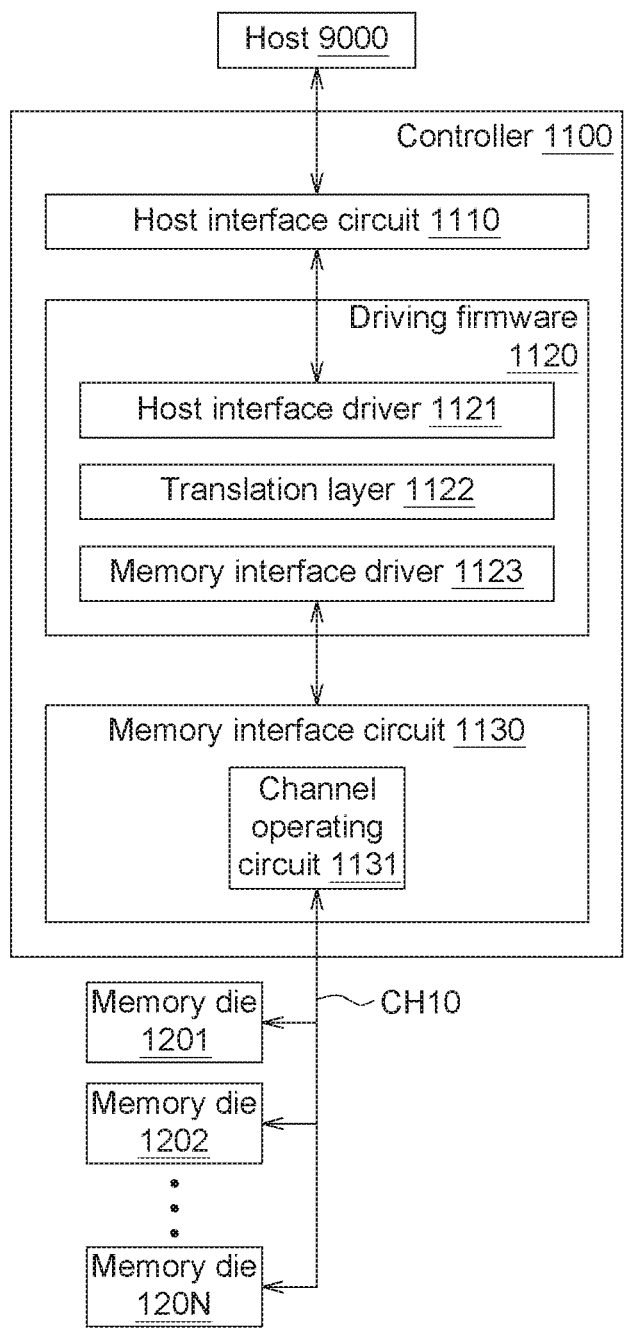
FIG. 1 shows a memory system according to one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which shows a memory system 1000 according to one embodiment of the present invention. The memory system 1000 includes a controller 1100 and a plurality of memory dies 1201, 1202, 1203, 1204, 1205, . . . , 120N. The controller 1100 is connected to a host 9000. The controller 1100 includes a host interface circuit 1110, a driving firmware 1120 and a memory interface circuit 1130. The host interface circuit 1110 is connected to the host 9000 for communicating with the host 9000. The memory interface circuit 1130 is connected to the memory dies 1201, 1202, 1203, 1204, 1205, . . . , 120N via single channel CH10 for communicating with the memory dies 1201, 1202, 1203, 1204, 1205, . . . , 120N. The driving firmware 1120 is connected between the host interface circuit 1110 and the memory interface circuit 1130 for providing the driver. The driving firmware 1120 includes a host interface driver 1121, a translation layer 1122 and a memory interface driver 1123. For example, each of the memory dies 1201, 1202, 1203, 1204, 1205, . . . , 120N may be a NAND flash and the translation layer 1122 may be a Flash Translation Layer (FTL). In another embodiment, each of the memory dies 1201, 1202, 1203, 1204, 1205, . . . , 120N may be a NOR flash, Phase-change memory (PCM) or a block of a hard disk. The memory interface circuit 1130 includes at least one channel operating circuit 1131 which is used for executing the memory dies 1201, 1202, 1203, 1204, 1205, . . . , 120N with the single channel CH10.

Figure 2:
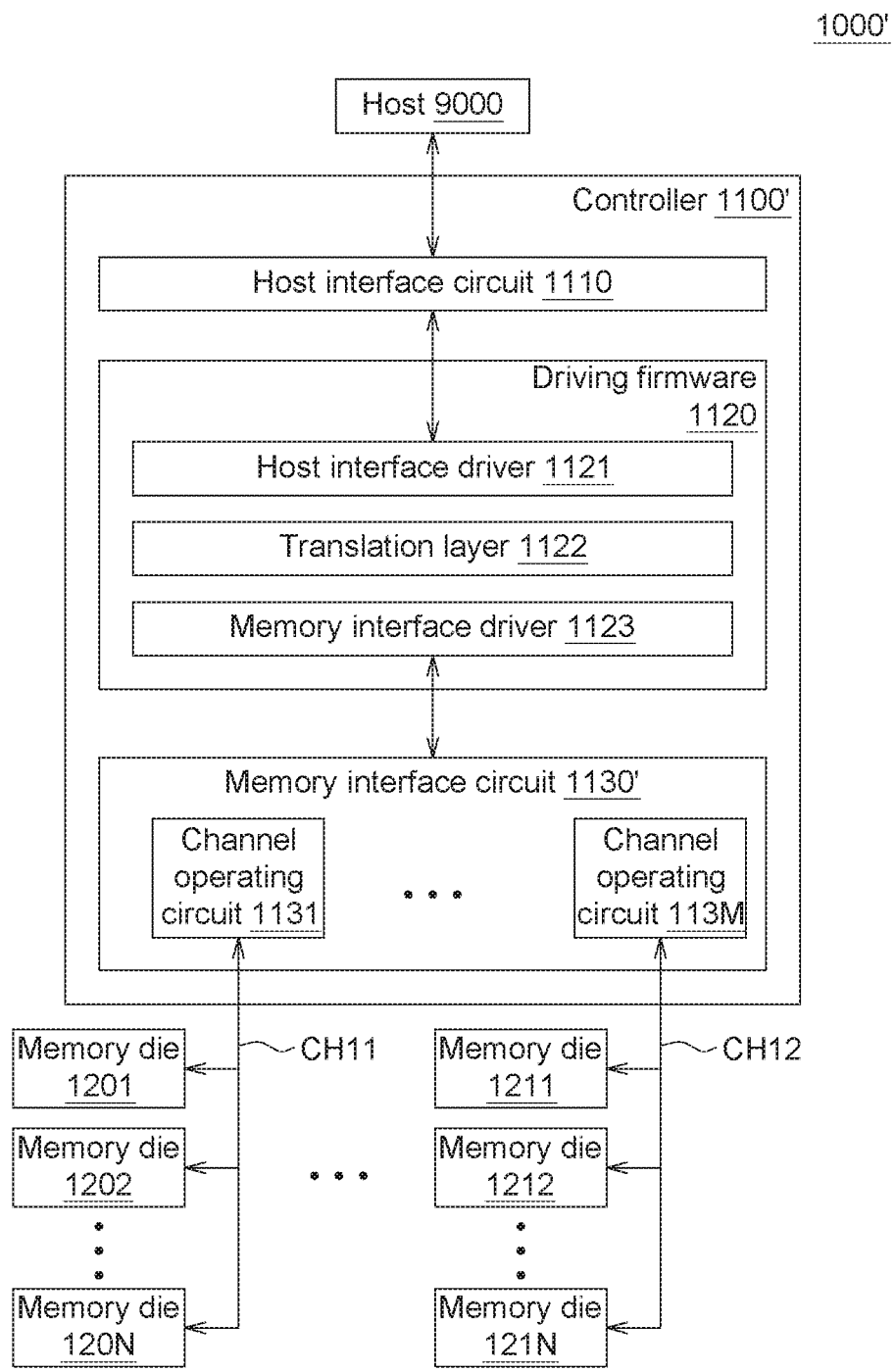
FIG. 2 shows another memory interface circuit which includes at least two channel operating circuits.

Please refer to FIG. 2, which shows another memory interface circuit 1130' which includes at least two channel operating circuits 1131, . . . , 113M. In the memory interface circuit 1130' of a controller 1100' of a memory system 1000'. One of the channel operating circuits 1131, . . . , 113M is used for executing the memory dies 1201, 1202, 1203, 1204, 1205, . . . , 120N with one channel CH11. Another channel operating circuit 113M is used for executing the memory dies 1211, 1202, 1203, 1204, 1205, . . . , 120N with another channel CH12. The number of the channel operating circuits 1131, . . . , 113M may be larger than two.

Figure 3:
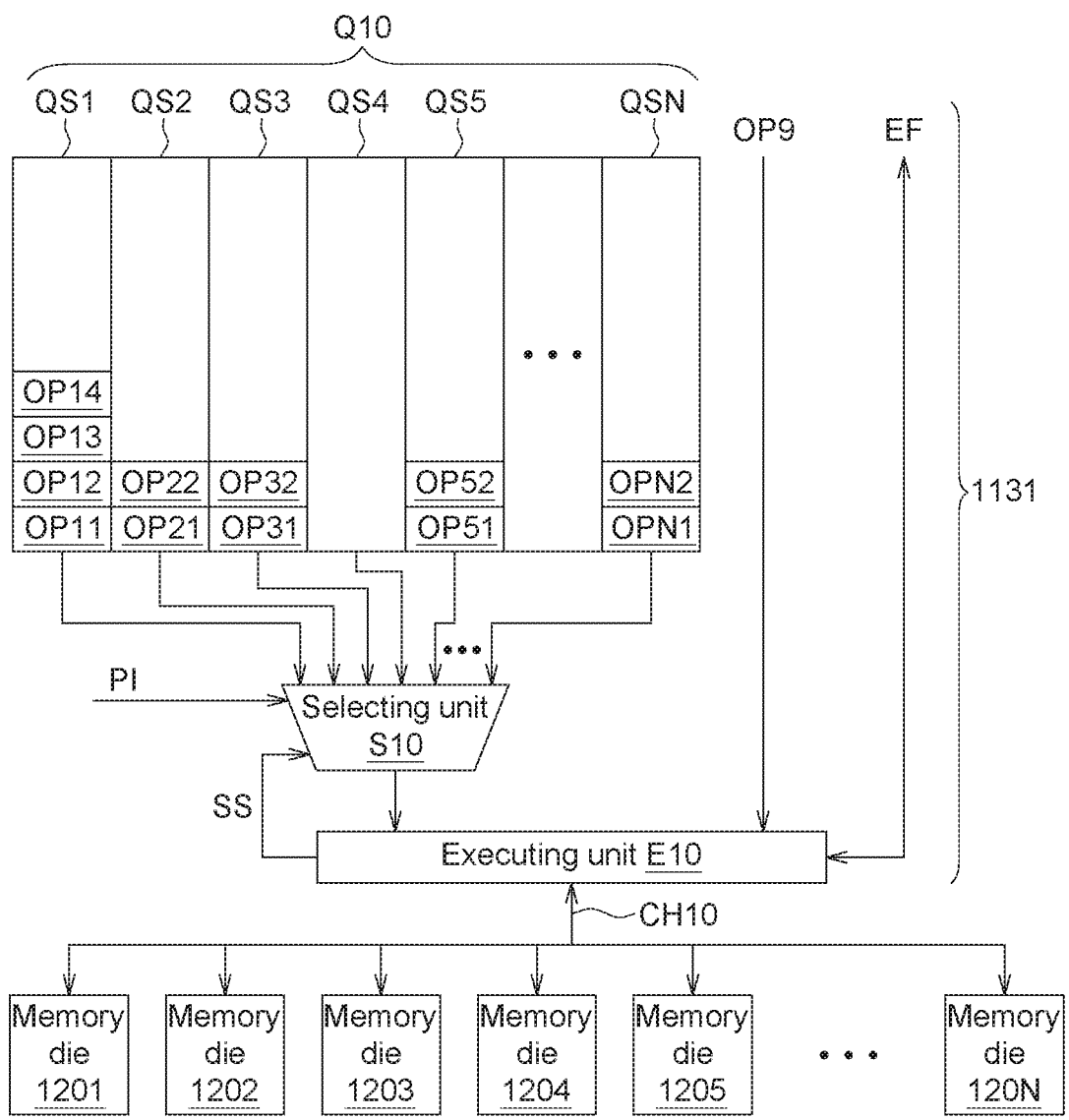
FIG. 3 shows an exemplified block diagram of a channel operating circuit.

Please refer to FIG. 3, which shows an exemplified block diagram of the channel operating circuit 1131. The channel operating circuit 1131 includes a command queue Q10, a selecting unit S10 and an executing unit E10. The command queue Q10 includes a plurality of queue sections QS1, QS2, QS3, QS4, QS5, . . . , QSN. Each of the queue sections QS1, QS2, QS3, QS4, QS5, . . . , QSN corresponds one of the memory dies 1201, 1202, 1203, 1204, 1205, . . . , 120N and is used for storing commands. For example, operations OP11, OP12, OP13, OP14, OP21, OP22, OP31, OP32, OP51, OP52, OPN1, OPN2 of some commands are stored in the command queue Q10. The selecting unit S10 is for selecting one of the queue sections QS1, QS2, QS3, QS4, QS5, . . . , QSN. The executing unit E10 is for executing the command in the queue sections QS1, QS2, QS3, QS4, QS5, . . . , QSN. An exception flag EF is used for exception handling. The operations of those elements are described with a flowchart.

Figure 4:
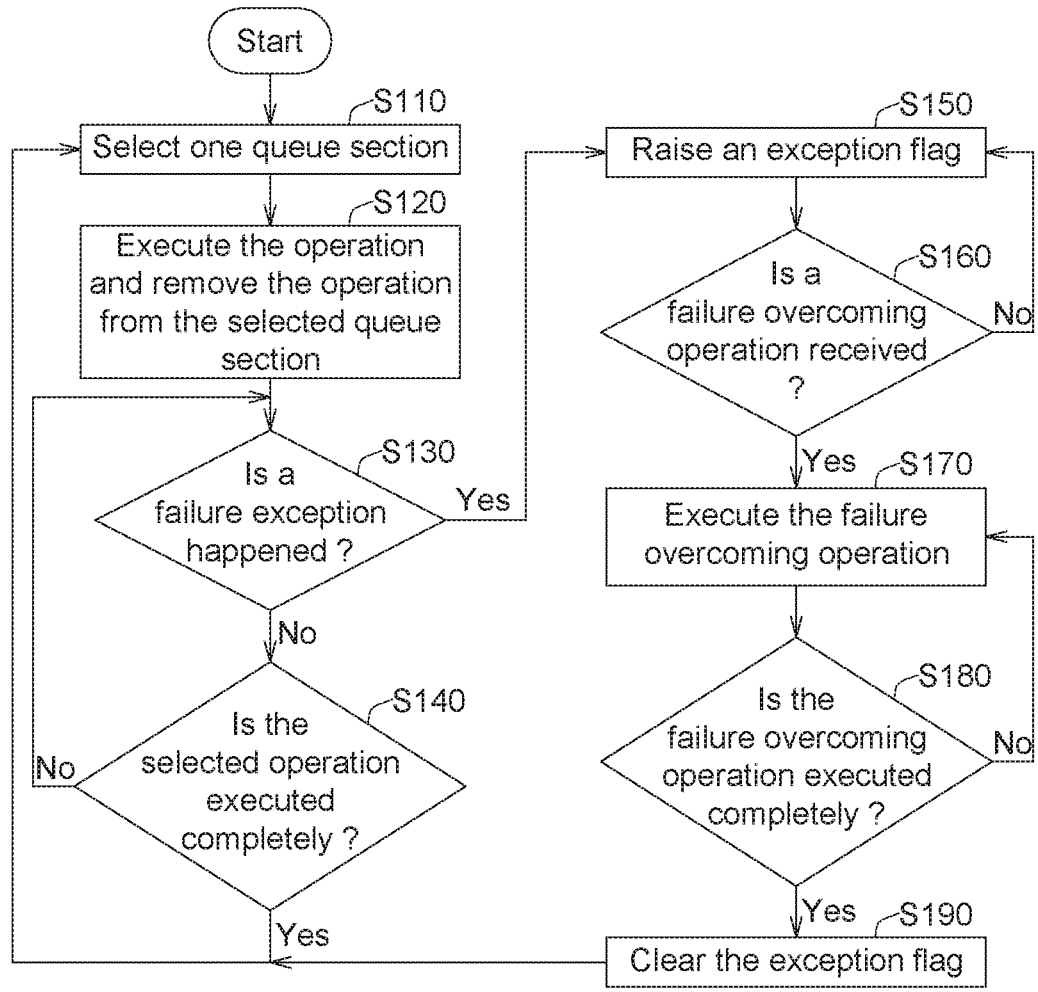
FIG. 4 illustrates a controlling method for executing a plurality of memory dies with the single channel according to one embodiment.
Figure 5:
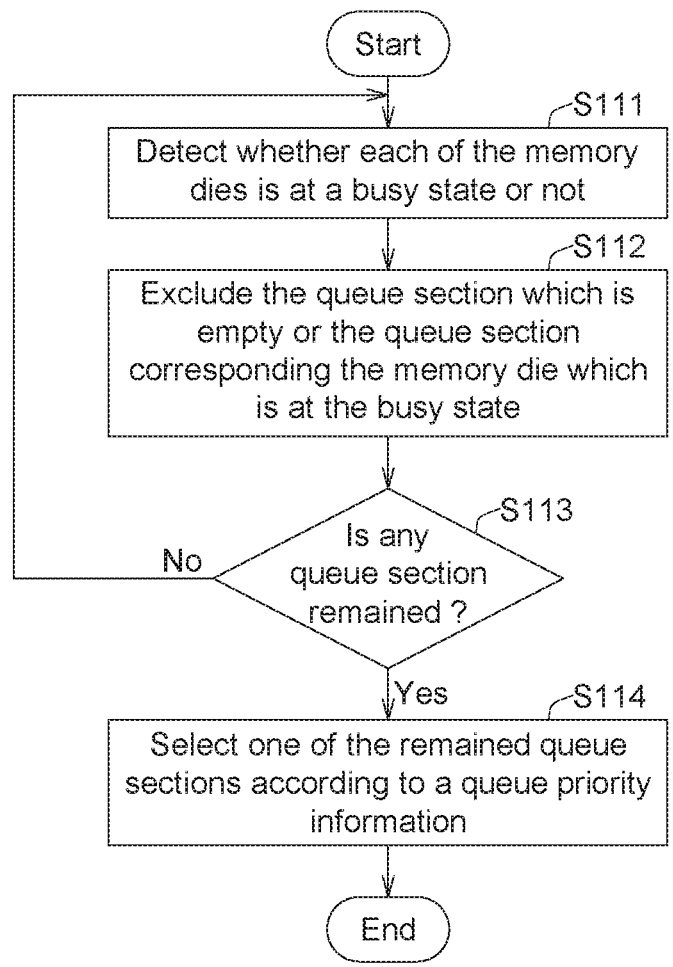
FIG. 5 illustrates detail steps of the step S110 of FIG. 4 according to one embodiment.

Please referring to FIG. 4, a controlling method for executing the memory dies 1201, 1202, 1203, 1204, 1205, . . . , 120N with the single channel CH10 according to one embodiment is illustrated. In step S110, the selecting unit S10 selects one of the queue sections QS1, QS2, QS3, QS4, QS5, . . . , QSN. Please refer to FIG. 5, which illustrates detail steps of the step S110 according to one embodiment. The step S110 includes steps S111 to S114.

In step S111, the executing unit E10 detects whether each of the memory dies 1201, 1202, 1203, 1204, 1205, . . . , 121N is at a busy state or not and sends a state signal SS to the selecting unit S10. For example, when a procedure that data is written from a buffer to a cell array is performed, this one of the memory dies 1201, 1202, 1203, 1204, 1205, . . . , 121N is at the busy state. Or, when a procedure that data is read from the cell array to the buffer is performed, this one of the memory dies 1201, 1212, . . . , 121N is at the busy state. Or, when a procedure that the cell array is erased is performed, this one of the memory dies 1201, 1202, 1203, 1204, 1205, . . . , 121N is at the busy state.

Figure 6A:
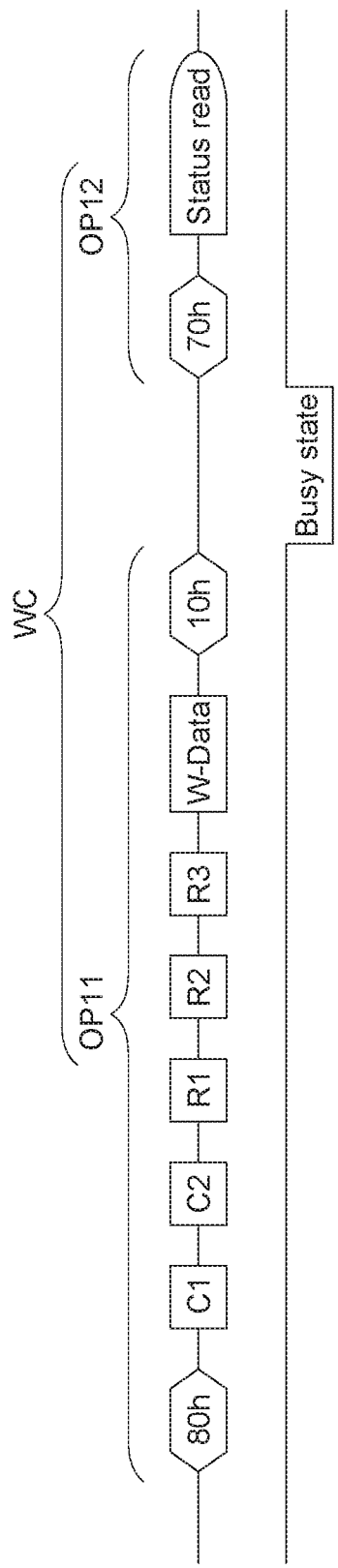
FIG. 6A illustrates the busy state while a writing command is executed.

Please refer to FIG. 6A, which illustrates the busy state while a writing command WC is executed. For example, the writing command WC is a NAND writing command. The writing command WC is divided into two operations OP11, OP12. When executing the operation OP11, data is written from a controller buffer to the NAND buffer in a NAND die. After executing the operation OP11, data is written from the NAND buffer to the cell array and this memory die 1201 is at the busy state.

Figure 6B:
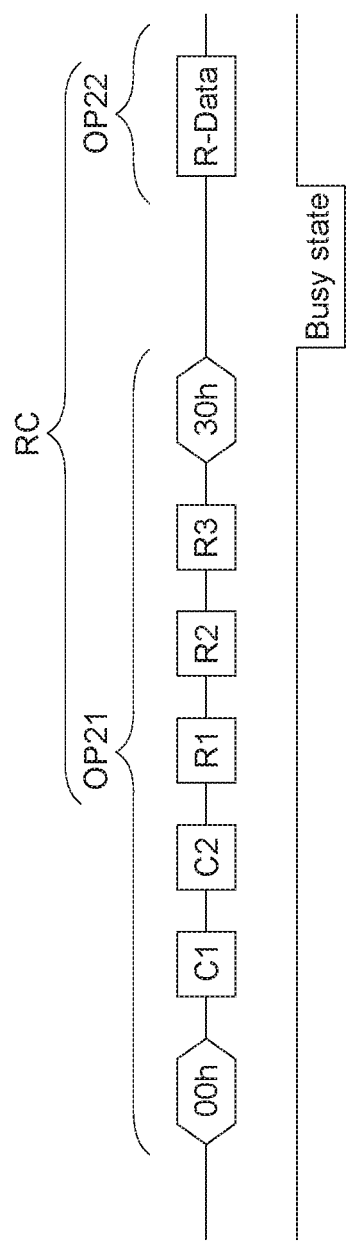
FIG. 6B illustrates the busy state while a reading command is executed.

Please refer to FIG. 6B, which illustrates the busy state while a reading command RC is executed. For example, the reading command RC is a NAND read command. A reading command RC is divided into two operations OP21, OP22. After executing the operation OP21, data is read from the cell array to the NAND buffer and this memory die 1202 is at the busy state. And data is read from the NAND buffer to the controller buffer in the operation OP22.

Figure 6C:
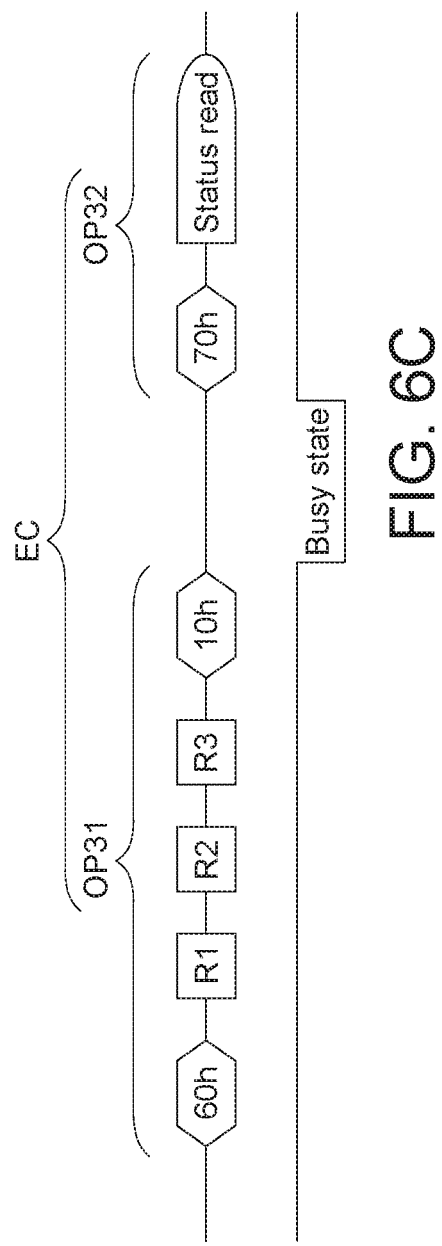
FIG. 6C illustrates the busy state while an erasing command is executed.

Please refer to FIG. 6C, which illustrates the busy state while an erasing command EC is executed. For example, the erasing command EC is a NAND erasing command. The erasing command EC is divided into two operations OP31, OP32. After executing the operation OP31 the cell array is erasing and this memory die 1203 is at the busy state.

In step S112, the selecting unit S10 excludes the queue section QS4 which is empty or the queue sections QS1, QS2, QS3 corresponding the memory die 1201, 1202, 1203 which are at the busy state.

In step S113, the selecting unit S10 determines whether any one of the queue sections QS1, QS2, QS3, QS4, QS5, . . . , QSN is remained. If at least one of the queue sections QS1, QS2, QS3, QS4, QS5, . . . , QSN is remained, the process proceeds to step S114.

In step S114, the selecting unit S10 selects one of the remained queue sections QS5, . . . , QSN according to a queue priority information PI. The queue priority information PI can be set according to a loading, a priority hint, a power budget or a combination thereof.

Figure 7:
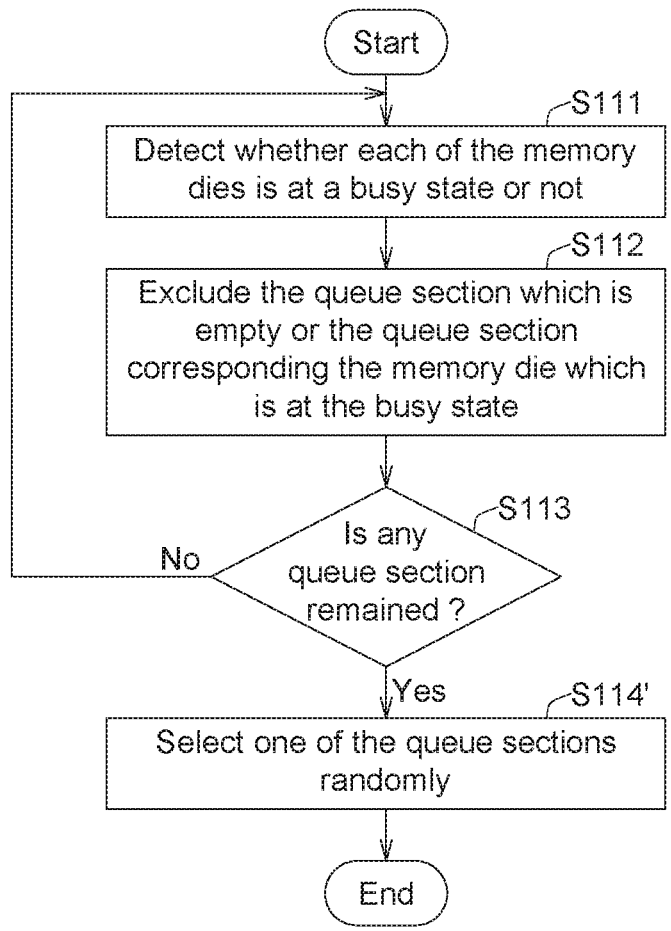
FIG. 7 illustrates detail steps of the step S110 of FIG. 4 according to another embodiment.

Please refer to FIG. 7, which illustrates detail steps of the step S110 according to another embodiment. In this embodiment, the selecting unit S10 selects one of the remained queue sections QS5, . . . , QSN randomly in step S114'.

In step S110, the selected queue section QS5 storing two operations OP51, OP52 is not empty and corresponds the memory dies 1205 which is not at a busy state. If more than one of the memory dies 1205, . . . , 120N are not empty and are not at the busy state, and any of queue sections QS5, . . . QSN corresponding those memory dies 1205, . . . , 120N can be selected randomly or selected according to the queue priority information PI.

In step S120, referring to FIG. 3, in the selected queue section QS5, first of the operations OP51 is executed and removed from the selected queue section QS5.

In step S130, the executing unit E10 determines whether a failure exception is happened or not. For example, the failure exception may be an Error-correcting code (ECC) fail, a power failure or a Direct Memory Access (DMA) halt. If the failure exception is not happened, then the process proceeds to step S140; if the failure exception is happened, then the process proceeds to step S150.

In step S140, the executing unit E10 determines whether the selected operation OP51 is executed completely. If the selected operation OP51 is executed completely, then the process returns to the step S110 to select another one of the queue sections QS5, . . . , QS5N; if the selected operation OP51 is not executed completely, then the process returns to the step S130 to check the failure exception.

In step S150, the executing unit E10 raises an exception flag EF which represents that one exception is happened and is not overcome yet.

In step S160, the executing unit E10 determines whether a failure overcoming operation OP9 is received. If the failure overcoming operation OP9 is received, then the process proceeds to step S170 and the executing unit E10 executes the failure overcoming operation OP9 for overcoming the failure exception.

In step S180, the executing unit E10 determines whether the failure overcoming operation OP9 is executed completely. If the failure overcoming operation OP9 is executed completely, then the process proceeds to step S190.

In step S190, the executing unit E10 clear the exception flag EF.

That is to say, after the queue section QS5 is selected according to the busy state, the command in the selected queue section QS5 is executed. Therefore, even if the memory dies 1201, 1202, 1203 are at the busy state, the queue section QS5 corresponding another memory die 1205 which is not at the busy state can be selected to execute the command. The bandwidth of the single channel CH10 can be efficiently used.

Figure 8:
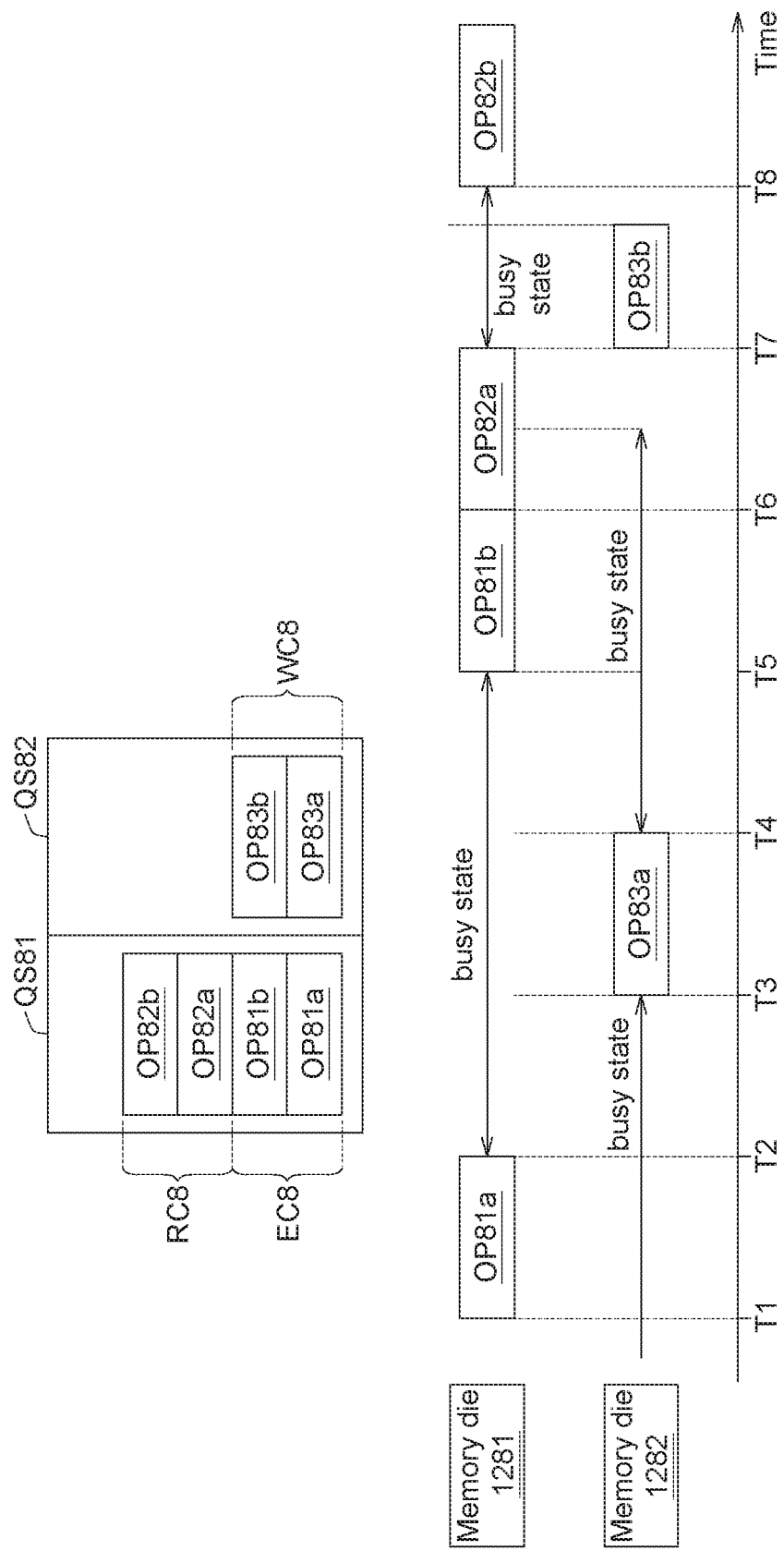
FIG. 8 illustrates a timing example of FIG. 4.

Please refer to FIG. 8, which illustrates a timing example of FIG. 4. An erasing command EC8 including two operations OP81a, OP81b, and a reading command RC8 including two operations OP82a, OP82b are stored in a queue section QS81. A writing command WC8 including two operations OP83a, OP83b is stored in a queue section QS82. At time T1, a memory die 1282 is at the busy state, so the queue section QS81 is selected by the selecting unit S10 and the operation OP81a is fetched and executed by the executing unit E10.

At time T2, both of the memory dies 1281, 1282 are at the busy state, so no operation is fetched and executed.

At time T3, the memory die 1282 is not at the busy state, so the queue section QS82 is selected by the selecting unit S10 and the operation OP83a is fetched and executed by the executing unit E10.

At time T4, both of the memory dies 1281, 1282 are at the busy state, so no operation is fetched and executed.

At time T5, the memory die 1281 is not at the busy state, so the queue section QS81 is selected by the selecting unit S10 and the operation OP81b is fetched and executed by the executing unit E10.

At time T6, the memory die 1281 is not at the busy state, so the queue section QS81 is selected by the selecting unit S10 and the operation OP82a is fetched and executed by the executing unit E10.

At time T7, the memory die 1282 is not at the busy state, so the queue section QS82 is selected by the selecting unit S10 and the operation OP83b is fetched and executed by the executing unit E10.

At time T8, the memory die 1281 is not at the busy state, so the queue section QS81 is selected by the selecting unit S10 and the operation OP82b is fetched and executed by the executing unit E10.

That is to say, when the memory die 1281 is at the busy state, the memory die 1282 which is not at the busy state can use the single channel CH10, and when the memory die 1282 is at the busy state, the memory die 1281 which is not at the busy state can use the single channel CH10; such that the bandwidth of the single channel CH10 can be used efficiently.

Figure 9:
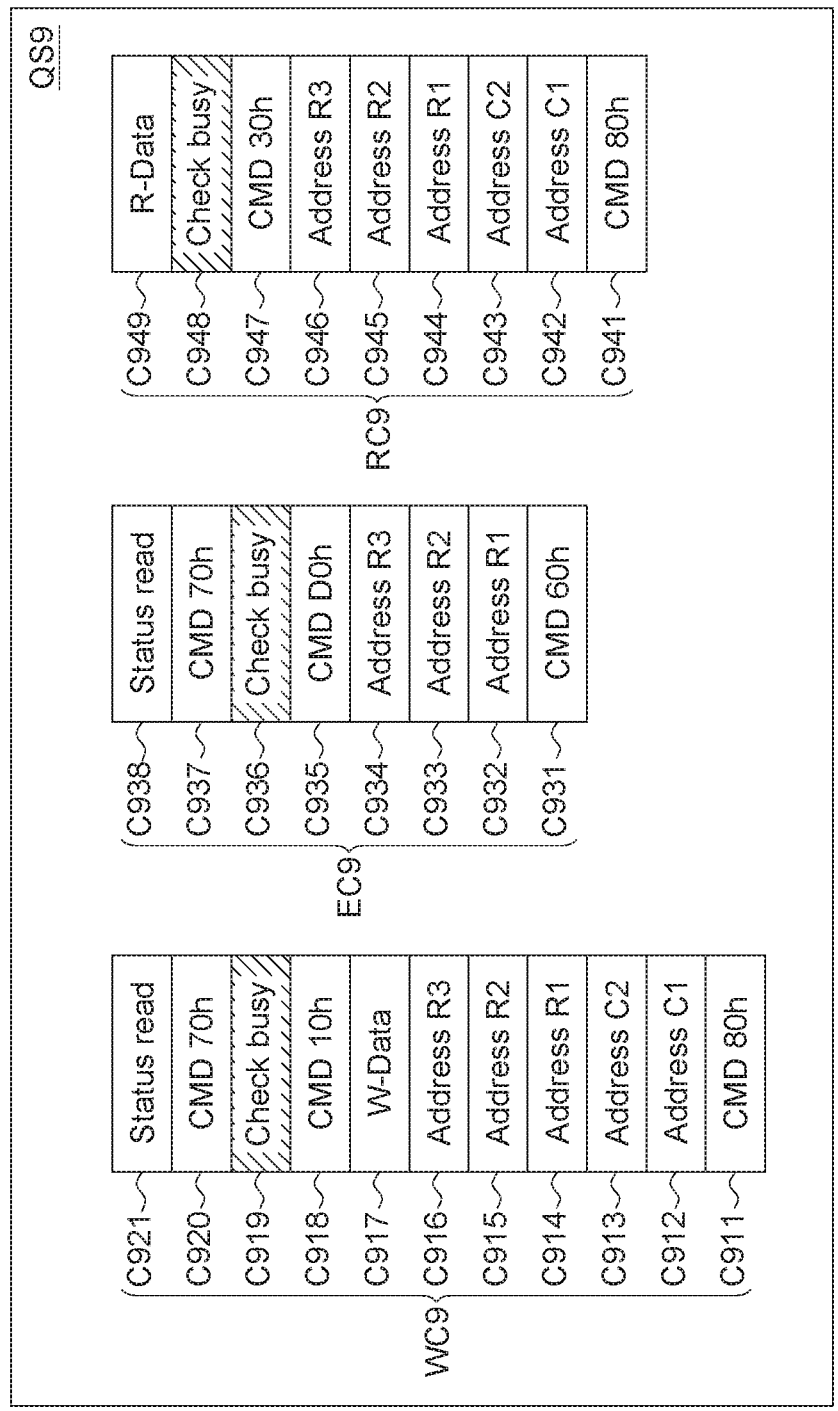
FIG. 9 shows a writing command, an erasing command and a reading command according to another embodiment.

Please refer to FIG. 9, which shows a writing command WC9, an erasing command EC9 and a reading command RC9 stored in a queue section QS9 according to another embodiment. The writing command WC9 includes a plurality of operation codes C911 to C921, the erasing command EC9 includes a plurality of operation codes C931 to C938, and the reading command RC9 includes a plurality of operation codes C941 to C949. The operation codes C919, C936, C948 are used to check whether the corresponding memory die (not shown) is at the busy state or not.

Figure 10:
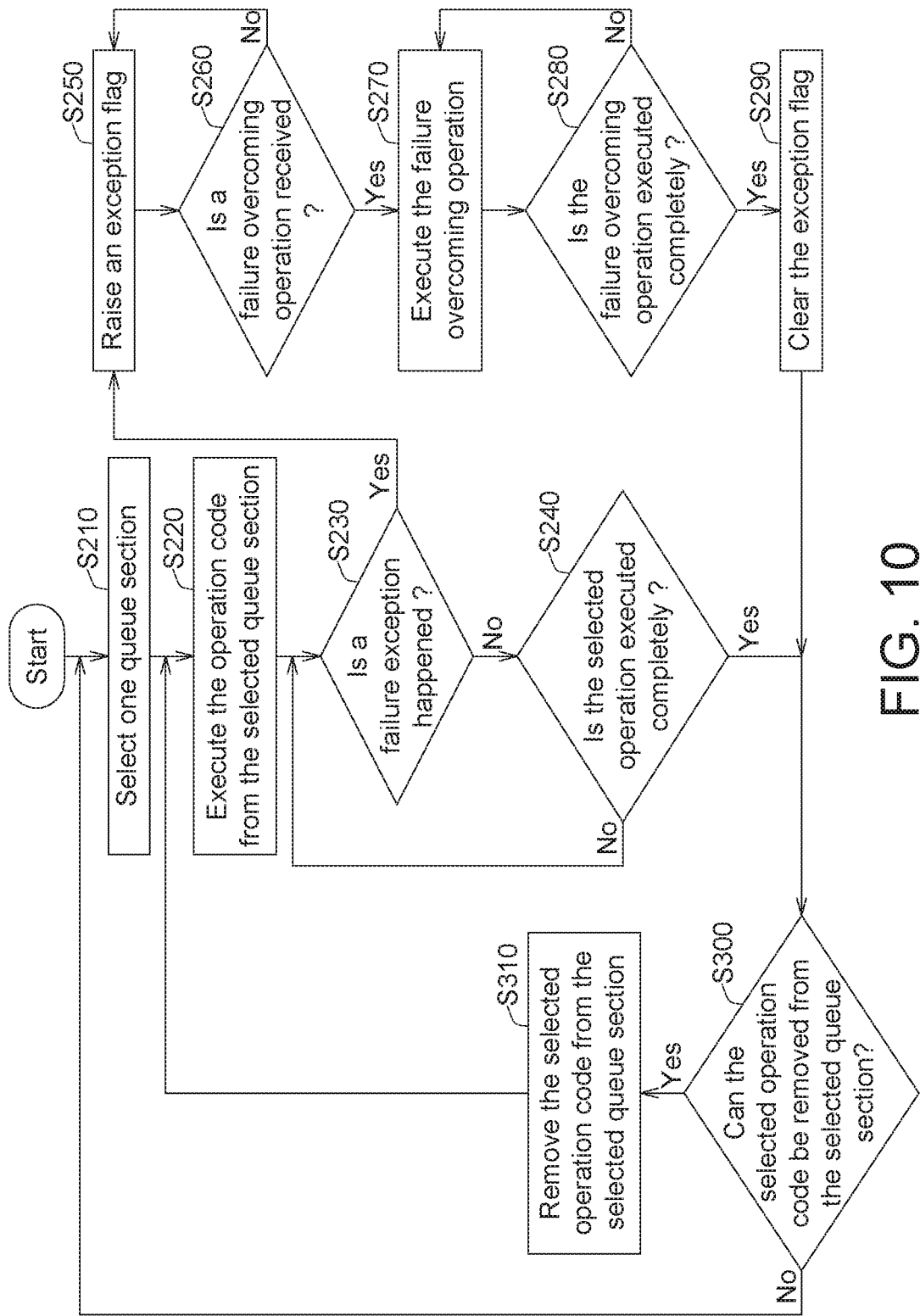
FIG. 10 illustrates a controlling method for executing the memory dies with the single channel according to another embodiment.
Figure 11:
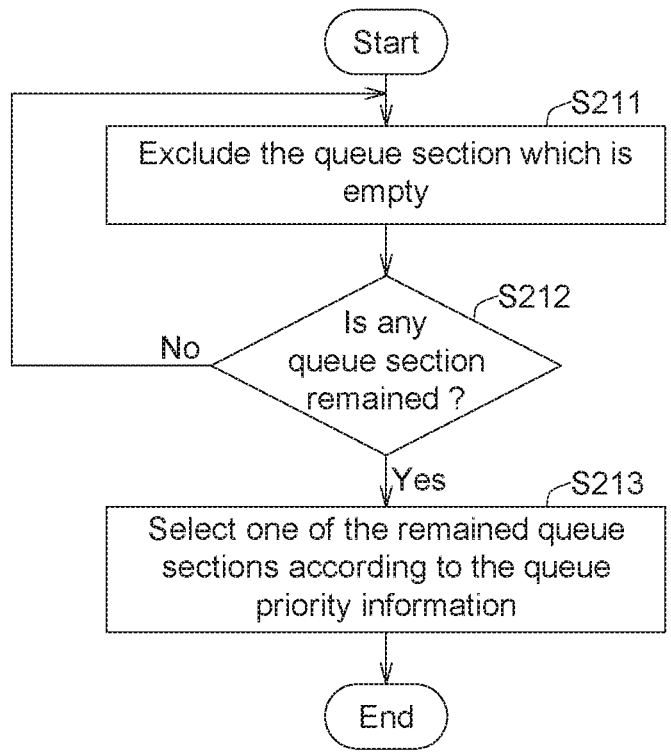
FIG. 11 illustrates detail steps of the step S210 of FIG. 10 according to one embodiment.

Please refer to FIG. 10, a controlling method for executing the memory dies 1201, 1202, 1203, 1204, 1205, . . . , 120N with the single channel CH10 according to another embodiment is illustrated. In step S210, the selecting unit S10 selects the queue section QS9. Please refer to FIG. 11, which illustrates detail steps of the step S210 according to one embodiment. The step S210 includes steps S211 to S213.

In step S211, the selecting unit S10 excludes the queue section QS4 which is empty.

In step S212, the selecting unit S10 determines whether any queue section is remained. If at least one queue section is remained, the process proceeds to step S213.

In step S213, the selecting unit S10 selects one of the remained queue sections QS5, . . . , QSN according to the queue priority information PI. The queue priority information PI can be set according to a loading, a priority hint, a power budget or a combination thereof.

Figure 12:
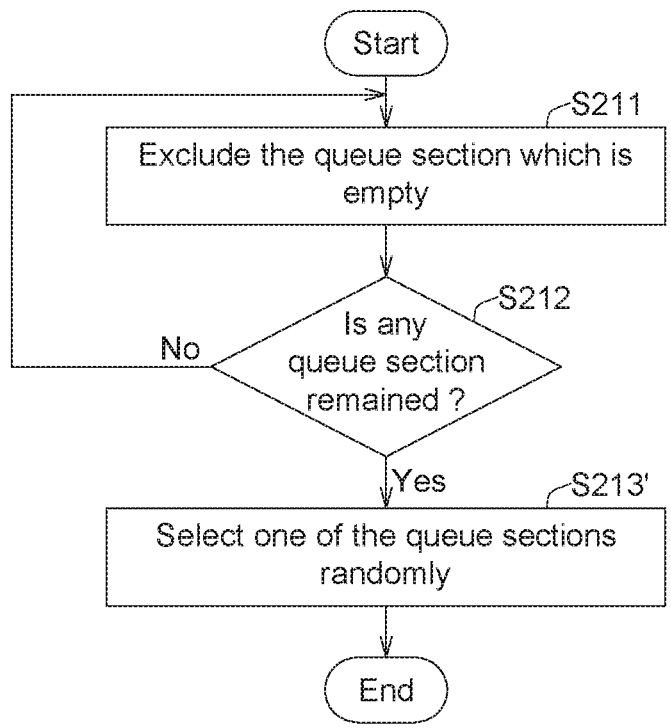
FIG. 12 illustrates detail steps of the step S210 according to another embodiment.

Please refer to FIG. 12, which illustrates detail steps of the step S210 according to another embodiment. In this embodiment, the selecting unit S10 selects one of the remained queue sections QS5, . . . , QSN randomly in step S213'.

In step S210, the selected queue section QS9 is not empty. If more than one memory dies 1205, . . . , 120N are not empty, and any of queue sections QS5, . . . QSN corresponding those memory dies 1205, . . . , 120N can be selected randomly or selected according to the queue priority information PI.

In step S220, referring to FIG. 9, in the selected queue section QS9, first of the operation codes, such as the operation code C911, is executed.

In step S230, the executing unit E10 determines whether a failure exception is happened or not. If the failure exception is not happened, then the process proceeds to step S240; if the failure exception is happened, then the process proceeds to step S250. The step S230 to the step S290 are similar to the step S130 to step S190 of FIG. 4, and the similarities are not repeated here.

After the selected operation code is executed completely, the process proceeds to step S300. In the step S300, the executing unit E10 determines whether the selected operation code can be removed from the selected queue section QS9. In this step, the operation codes C919, C936, C948 are used to check whether the corresponding memory dies are at the busy state, so the operation codes C919, C936, C948 cannot be removed, such that whether the corresponding memory dies are at the busy state can be kept checking. If the selected operation code can be removed from the selected queue section QS9, then the process proceeds to step S310; if the selected operation code cannot be removed from the selected queue section QS9, then the process returns to step S210.

In step S310, the executing unit E10 removes the selected operation code from the selected queue section QS9.

That is to say, after the queue section QS9 is selected according to the busy state, the command in the selected queue section QS9 is executed. Therefore, even if the memory dies 1201, 1202, 1203 are at the busy state, the queue section QS9 corresponding another memory die 1209 which is not at the busy state can be selected to execute the command. The bandwidth of the single channel CH10 can be efficiently used.

Figure 13:
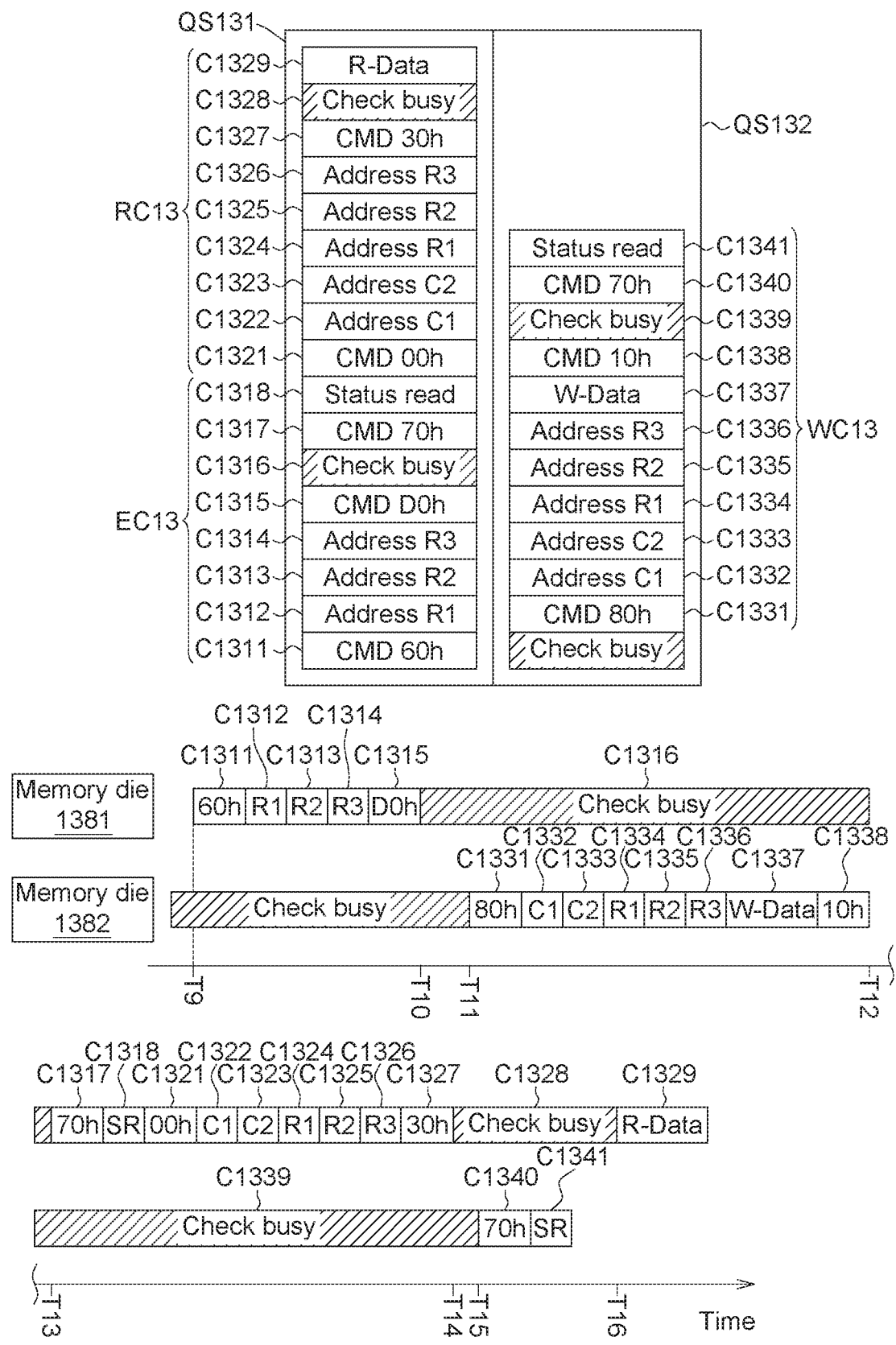
FIG. 13 illustrates a timing example of FIG. 10.

Please refer to FIG. 13, which illustrates a timing example of FIG. 10. An erasing command EC13 including operation codes C1311 to C1318, and a reading command RC13 including operation codes C1321 to C1329 are stored in a queue section QS131. The operation codes C1316, C1328 are used for checking whether the memory die 1381 is at the busy state or not. A writing command WC13 including operation codes C1331 to C1341 is stored in a queue section QS132. The operation code C1339 is used for checking whether the memory die 1382 is at the busy state or not.

At time T9, a memory die 1382 is at the busy state, so the queue section QS131 is selected by the selecting unit S10 and the operation codes C1311 to C1316 are fetched and executed by the executing unit E10. When the operation code C1316 is executed, the executing unit E10 knows that the memory die 1281 is at the busy state.

At time T10, both of the memory dies 1381, 1382 are at the busy state, and both check busy operation codes in the queue section QS131 and the queue section QS132 are executed repeatedly because both check busy operation codes are not removed from the queue section QS131 and the queue section QS132.

At time T11, the memory die 1382 is not at the busy state, so the queue section QS132 is selected by the selecting unit S10 and the operation codes C1331 to C1339 are fetched and executed by the executing unit E10. When the operation code C1339 is executed, the executing unit E10 knows that the memory die 1282 is at the busy state.

At time T12, both of the memory dies 1381, 1382 are at the busy state, and both check busy operation codes in the queue section QS131 and the queue section QS132 are executed repeatedly because both check busy operation codes are not removed from the queue section QS131 and the queue section QS132.

At time T13, the memory die 1381 is not at the busy state, so the queue section QS131 is selected by the selecting unit S10 and the operation codes C1317 to C1318, C1321 to C1328 are fetched and executed by the executing unit E10. When the operation code C1327 is executed, the executing unit E10 knows that the memory die 1281 is at the busy state.

At time T14, both of the memory dies 1381, 1382 are at the busy state, and both check busy operation codes in the queue section QS131 and the queue section QS132 are executed repeatedly because both check busy operation codes are not removed from the queue section QS131 and the queue section QS132.

At time T15, the memory die 1282 is not at the busy state, so the queue section QS132 is selected by the selecting unit S10 and the operation codes C1340, C1341 are fetched and executed by the executing unit E10.

At time T16, the memory die 1381 is not at the busy state, so the queue section QS131 is selected by the selecting unit S10 and the operation code C1329 is fetched and executed by the executing unit E10.

That is to say, when the memory die 1381 is at the busy state, the memory die 1382 which is not at the busy state can use the single channel CH10, and when the memory die 1382 is at the busy state, the memory die 1381 which is not at the busy state can use the single channel CH10; such that the bandwidth of the single channel CH10 can be used efficiently.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A controlling method for executing a plurality of memory dies with single channel, wherein the plurality of memory dies corresponds to a plurality of queue sections of a command queue, and the controlling method comprises:

selecting, by a selecting unit, one of the plurality of queue sections which is not at a busy state; and
   executing, by an executing unit, a command stored in the one of the plurality of queue sections which is selected;
   wherein the busy state corresponds to a procedure being performed where data is written from a buffer to a cell array, a procedure where data is read from the cell array to the buffer, or a procedure where the cell array is erased; and
   wherein the command is divided into two operations, in the step of executing the command in the one of the plurality of queue sections which is selected, first of the two operations is executed and then removed from one of the plurality of queue sections which is selected.

2. The controlling method according to claim 1, wherein one of the two operations is executed before the busy state, the other of the two operations is executed after the busy state, and the two operations are sequentially stored in one of the plurality of queue sections.

3. The controlling method according to claim 1, further comprising:

determining, by the executing unit, whether a failure exception is happened; and
   executing, by the executing unit, a failure overcoming operation for overcoming the failure exception.

4. The controlling method according to claim 1, wherein in the step of selecting one of the plurality of queue sections, the one of the plurality of queue sections is selected by an auxiliary queue prior information.

5. The controlling method according to claim 4, wherein the auxiliary queue prior information is a loading, a priority hint, a power budget or a combination thereof.

6. The controlling method according to claim 1, wherein in the step of selecting one of the plurality of queue sections, the one of the plurality of queue sections is selected randomly.

7. The controlling method according to claim 1, wherein the command includes a plurality of operation codes, in the step of executing the command, first of the plurality of operation codes is executed.

8. The controlling method according to claim 7, wherein one of the plurality of operation codes is used to check whether one of the plurality of memory dies is at the busy state or not.

9. A channel operating circuit, for executing a plurality of memory dies with single channel, wherein the channel operating circuit comprises:

a command queue including a plurality of queue sections, which correspond the plurality of memory dies;
   a selecting unit for selecting one of the plurality of queue sections which is corresponding one of the plurality of memory dies which is not at a busy state; and
   an executing unit for executing a command stored in one of the plurality of queue sections which is selected;
   wherein the busy state corresponds to a procedure being performed where data is written from a buffer to a cell array, a procedure where data is read from the cell array to the buffer, or a procedure where the cell array is erased; and
   wherein the command is divided into two operations, and first of the two operations in one of the plurality of queue sections which is selected is executed and removed from one of the plurality of queue sections which is selected by the executing unit.

10. The channel operating circuit according to claim 9, wherein one of the two operations is executed before the busy state, other of the two operations is executed after the busy state, and the two operations are sequentially stored in one of the plurality of queue sections.

11. The channel operating circuit according to claim 9, wherein the executing unit is further for raising a failure exception flag when a failure exception is happened and executing a failure overcoming operation for overcoming the failure exception.

12. The channel operating circuit according to claim 9, wherein the selecting unit selects one of the plurality of queue sections by an auxiliary queue prior information, and the auxiliary queue prior information is a loading, a priority hint, a power budget or a combination thereof.

13. The channel operating circuit according to claim 9, wherein the selecting unit selects one of the plurality of queue sections randomly.

14. The channel operating circuit according to claim 9, wherein the command includes a plurality of operation codes, and the executing unit executes first of the plurality of operation codes.

15. The channel operating circuit according to claim 14, wherein one of the plurality of operation codes is used to check whether one of the plurality of memory dies is at the busy state or not.

16. A memory system, comprising:
a plurality of memory dies; and
a controller, including:
a memory interface circuit, including at least one channel operating circuit for executing the plurality of memory dies with single channel, wherein the channel operating circuit comprises:
a command queue including a plurality of queue sections, which correspond the plurality of memory dies;
a selecting unit for selecting one of the plurality of queue sections corresponding one of the plurality of memory dies which is not at a busy state; and
an executing unit for executing a command stored in one of the plurality of queue sections which is selected;
wherein the busy state corresponds to a procedure being performed where data is written from a buffer to a cell array, a procedure where data is read from the cell array to the buffer, or a procedure where the cell array is erased; and
wherein the command is divided into two operations, and first of the two operations in one of the plurality of queue sections which is selected is executed and removed from one of the plurality of queue sections which is selected by the executing unit.

* * * * *